US008669889B2

(12) United States Patent  (10) Patent No.: US 8,669,889 B2
Jaquette  (45) Date of Patent: Mar. 11, 2014

(54) USING VARIABLE LENGTH CODE TABLES TO COMPRESS AN INPUT DATA STREAM TO A COMPRESSED OUTPUT DATA STREAM

(75) Inventor: Glen A. Jaquette, Tucson, AZ (US)

(73) Assignee: International Business Machines Corporation, Armonk, NY (US)

(*) Notice: Subject to any disclaimer, the term of this patent is extended or adjusted under 35 U.S.C. 154(b) by 66 days.

(21) Appl. No.: 13/188,405

(22) Filed: Jul. 21, 2011

(65) Prior Publication Data

US 2013/0021179 A1    Jan. 24, 2013

(51) Int. Cl.
H03M 7/34    (2006.01)

(52) U.S. Cl.
USPC .............................................. 341/51; 341/87

(58) Field of Classification Search
USPC ........ 341/51, 67, 50, 57, 59, 65, 87; 375/341, 375/265, 270, 148; 370/477; 707/5
See application file for complete search history.

(56) References Cited

U.S. PATENT DOCUMENTS

| | | | |
|---|---|---|---|
| 4,725,815 A | | 2/1988 | Mitchell et al. |
| 5,016,009 A | | 5/1991 | Whiting et al. |
| 5,412,384 A | | 5/1995 | Chang et al. |
| 5,534,861 A | | 7/1996 | Chang et al. |
| 5,874,908 A | * | 2/1999 | Craft .............................. 341/87 |
| 5,877,711 A | | 3/1999 | Craft |
| 5,963,642 A | | 10/1999 | Goldstein |
| 5,968,132 A | | 10/1999 | Tokunaga et al. |
| 5,974,144 A | | 10/1999 | Brandman |
| 6,218,970 B1 | | 4/2001 | Jaquette |
| 7,003,111 B2 | | 2/2006 | Jaquette |
| 7,215,259 B2 | | 5/2007 | Kerber et al. |
| 7,623,047 B2 | | 11/2009 | Ordentlich et al. |
| 7,788,106 B2 | | 8/2010 | Herre et al. |
| 2001/0029574 A1 | | 10/2001 | Razdan et al. |

(Continued)

FOREIGN PATENT DOCUMENTS

| | | |
|---|---|---|
| EP | 0977152 | 2/2000 |
| EP | 1578019 | 9/2005 |

(Continued)

OTHER PUBLICATIONS

P. Deutsch, "DEFLATE Compress Data Format Specification version 1.3", Network Working Group, RFC 1951, May 1996, pp. 1-15.

(Continued)

*Primary Examiner* — Joseph Lauture
(74) *Attorney, Agent, or Firm* — Konrad Raynes Davda & Victor LLP

(57) ABSTRACT

Provided are a computer program product, system, method, and data structure for using variable length code tables to compress an input data stream to a compressed output data stream. If a number of consecutive data units in the input data stream match the number of consecutive data units in a history buffer of previously received data units in the input data stream, a copy pointer symbol is generated indicating the copy pointer symbol referencing previously received data units in the history buffer and indicating a location of a start of the consecutive data units in the history buffer. A determination is made from a variable length code table of an encoding of the number. Indication is made in the generated copy pointer symbol the determined encoding of the number and the copy pointer symbol is outputted in the compressed output data stream.

27 Claims, 14 Drawing Sheets

(56) References Cited

U.S. PATENT DOCUMENTS

| | | |
|---|---|---|
| 2002/0166022 A1 | 11/2002 | Suzuki |
| 2003/0105928 A1 | 6/2003 | Ash et al. |
| 2004/0210551 A1 | 10/2004 | Jones et al. |
| 2005/0073884 A1 | 4/2005 | Gonzalez et al. |
| 2005/0210151 A1 | 9/2005 | Abdo et al. |
| 2005/0257083 A1 | 11/2005 | Cousins |
| 2006/0235679 A1 | 10/2006 | Sperschneider et al. |
| 2006/0235683 A1 | 10/2006 | Sperschneider et al. |
| 2006/0235865 A1 | 10/2006 | Sperschneider et al. |
| 2009/0164455 A1 | 6/2009 | Weinberg et al. |
| 2010/0079311 A1 | 4/2010 | Sluiter |
| 2010/0191907 A1 | 7/2010 | Ish |
| 2011/0060598 A1 | 3/2011 | Sperschneider et al. |

FOREIGN PATENT DOCUMENTS

| | | |
|---|---|---|
| JP | 6309144 | 11/1994 |
| JP | 2008536182 | 9/2008 |
| JP | 2008536410 | 9/2008 |
| JP | 2008536411 | 9/2008 |
| WO | 2006108463 | 10/2006 |
| WO | 2006108464 | 10/2006 |

OTHER PUBLICATIONS

"Streaming Lossless Data Compression Algorithm—(SLDC)", ECMA Standardizing Information and Communication Systems, Standard ECMA-321, Jun. 2001, pp. 1-20.

"Deflate", Wikipedia, [online], [retrieved Mar. 25, 2011], pp. 1-6, http://en.wikipedia.org/w/index.php?title=DEFLATE&printable=yespp.

"Huffman Coding", [online], [retrieved Apr. 3, 2011], pp. 1-11, http://en.wikipedia.org/w/index.php?title=Huffman_coding&printable=yes.

US Patent Application entitled "Using Variable Length Code Tables to Compress an Input Data Stream to a Compressed Output Data Stream", filed Jul. XX, 2011, by inventor G.A. Jaquette.

"Technique to Generate very Efficient Compression/Decompression Engines for XML Data Streams Based on the Stream's DTD", IP.com, Document No. IPCOM000013426D, Published Feb. 1, 2000, pp. 1-3.

J. Jo et al., "Fast Construction of Suffix Arrays for DNA Strings", Journal of Korean Information Science Society: Computer Systems and Theory, vol. 34, No. 7-8, pp. 319-326, Aug. 2007.

Y.E. Yang, et al., "Memory-Efficient Pipelined Architechure for Large-Scale String Matching", US National Science Foundation, Grant CCR-0702784, Apr. 2009, pp. 1-8.

U.S. Appl. No. 13/342,899, filed Jan. 3, 2012 by inventors Roy D. Cideciyan, et al.

Combined Search and Examination Report dated Nov. 15, 2012 for Application No. GB1212904.5.

Notice of Allowance dated Nov. 9, 2012, pp. 1-18, for U.S. Appl. No. 13/188,401, filed Jul. 21, 2011 by inventor Glen A. Jaquette.

Response dated Jan. 30, 2013 to Combined Search and Examination Report dated Nov. 15, 2012 for Application No. GB1212904.5.

International Search Report & Written Opinion dated Apr. 16, 2013, for Serial No. PCT/IB2012/057449, filed Dec. 19, 2012.

U.S. Appl. No. 13/761,114, filed Feb. 6, 2013 by inventor Glen A. Jaquette.

U.S. Appl. No. 13/766,762, filed Feb. 13, 2013 by inventor Glen A. Jaquette.

Notice of Allowance dated Apr. 16, 2013, pp. 1-15, for U.S. Appl. No. 13/342,899, filed Jan. 3, 2012 by inventors Roy D. Cideciyan, et al.

U.S. Appl. No. 13/779,309, filed Feb. 27, 2013.

Office Action dated Nov. 5, 2013, pp. 33, for U.S. Appl. No. 13/779,309, filed Feb. 27, 2013.

\* cited by examiner

FIG. 1 PRIOR ART — Literal Data Symbol

FIG. 2 PRIOR ART — Copy Pointer Symbol

| Match String Length (bytes) | Match count Field value |
|---|---|
| 2 | 0 0 |
| 3 | 0 1 |
| 4 | 10 00 |
| 5 | 10 01 |
| 6 | 10 10 |
| 7 | 10 11 |
| 8 | 110 000 |
| 9 | 110 001 |
| : | : |
| 15 | 110 111 |
| 16 | 1110 0000 |
| 17 | 1110 0001 |
| : | : |
| 31 | 1110 1111 |
| 32 | 1111 00000000 |
| 33 | 1111 00000001 |
| : | : |
| 270 | 1111 11101110 |
| 271 | 1111 11101111 |
| Reserved and Control Symbols | 1111 11110000 : 1111 11111111 |

Match Count Field Table

| Huffman Encoding: (total bits) | Relative Displacement Count | Relative Displacement Count start | Relative Displacement Count end |
|---|---|---|---|
| 152 — 0.0.0.<8 bits> (11) | Most recent 256 | 0 | 255 |
| 154 — 0.0.10.<8 bits> (12) | 256 before that | 256 | 511 |
| 156 — 0.0.11.<9 bits> (13) | 512 before that | 512 | 1023 |
| 158 — 0.10.<10 bits> (13) | 1024 before that | 1024 | 2047 |
| 160 — 0.11.<11 bits> (14) | 2048 before that | 2048 | 4095 |
| 162 — 10.<12 bits> (14) | 4096 before that | 4096 | 8191 |
| 164 — 11.<13 bits> (15) | 8192 before that | 8192 | 16385 |

Displacement Count Variable Length Code Table for 16KB History Buffer

FIG. 7

| Huffman Encoding: (total bits) | Relative Displacement Count | Relative Displacement Count start | Relative Displacement Count end |
|---|---|---|---|
| 172 — 0.0.<8 bits> (10) | Most recent 256 | 0 | 255 |
| 174 — 0.10.<8 bits> (11) | 256 before that | 256 | 511 |
| 176 — 0.11.<9 bits> (12) | 512 before that | 512 | 1023 |
| 178 — 1.00.<10 bits> (13) | 1024 before that | 1024 | 2047 |
| 180 — 1.01.<11 bits> (14) | 2048 before that | 2048 | 4095 |
| 182 — 1.1.<12 bits> (14) | 4096 before that | 4096 | 8191 |

Displacement Count Variable Length Code Table for 8KB History Buffer

FIG. 8

| Huffman Encoding; (total bits) | Relative Displacement Count | Relative Displacement Count start | Relative Displacement Count end |
|---|---|---|---|
| 0.<8 bits> (11) | Most recent 256 | 0 | 255 |
| 10.<8 bits> (12) | 256 before that | 256 | 511 |
| 11.<9 bits> (13) | 512 before that | 512 | 1023 |

Minimum Displacement Count Variable Length Code Table

FIG. 9

| Huffman Encoding; (total bits) | Match Count Range |
|---|---|
| 0.<1 bit> (2) | 2B to 3B |
| 10.<1 bit> (3) | 4B to 5B |
| 110.<1 bit> (4) | 6B to 7B |
| 1110.<1 bit> (5) | 8B to 9B |
| 1111.0.<1 bit> (6) | 10B to 11B |
| 1111.10.<2 bits> (8) | 12B to 15B |
| 1111.110.<3 bits> (10) | 16B to 23B |
| 1111.1110.<3 bits> (11) | 24B to 31B |
| 1111.1111.<8 bits> (16) | 32B to 271B |

Match Count Variable Length Code Table

FIG. 10

| Huffman Encoding; (total bits) | Relative Displacement Count | Index Location start | Index Location end |
|---|---|---|---|
| 0. <6 bits> (7) | Most recent 64 | 0 | 63 |
| 10. <6 bits> (8) | 64 before that | 64 | 127 |
| 11. <7 bits> (9) | 128 before that | 128 | 255 |

Literal Variable Length Code Table

FIG. 11

| Control Symbol | Value | Pad |
|---|---|---|
| Flush | 1 1111 1111 1111 1111 0000 | ZEROs |
| Scheme 1 | 1 1111 1111 1111 1111 0001 | None |
| Scheme 2 | 1 1111 1111 1111 1111 0010 | None |
| File Mark | 1 1111 1111 1111 1111 0011 | ZEROs |
| EOR | 1 1111 1111 1111 1111 0100 | ZEROs |
| Reset 1 | 1 1111 1111 1111 1111 0101 | None |
| Reset 2 | 1 1111 1111 1111 1111 0110 | None |
| End Marker | 1 1111 1111 1111 1111 1111 | ONEs |

Control Symbol Value Table

FIG. 12

USING VARIABLE LENGTH CODE TABLES TO COMPRESS AN INPUT DATA STREAM TO A COMPRESSED OUTPUT DATA STREAM

BACKGROUND OF THE INVENTION

1. Field of the Invention

The present invention relates to a computer program product, system, method, and data structure for using variable length code tables to compress an input data stream to a compressed output data stream.

2. Description of the Related Art

Data compression involves converting symbols, including data symbols and control symbols, in an input data stream into a compressed output data stream comprising less data than the input data stream. Control symbols are encoded into the compressed data stream and provide decoding instructions to allow decompression, and may be created by the application program which is compressing data. Examples of control symbols created by the application include an end of record control signal, a file mark, and a dataset boundary. There are other events or controls determined by the compression device, such as when to swap to a given compression scheme, and when to reset the history buffer used to perform compression in a given scheme. The compressing device may decide to create an access point at which compression begins with a reset history buffer using a particular scheme after a dataset boundary is encountered.

One type of encoding technique, Huffman coding, provides a lossless compression algorithm that uses a variable length code table for encoding source symbols where the variable length code table has been derived based on the estimated probability of occurrence for each possible source symbol value to produce encodings of the source symbols.

A streaming lossless data compression algorithm (SLDC) receives an input data stream of control symbols and data symbols and converts strings of consecutive bytes of data symbols into copy pointers and literal data symbols that have fewer bits than the data symbols in the input data stream. The SLDC algorithm is used to compress and decompress data in Linear Tape Open (LTO) magnetic tape cartridges. Details of the SLDC algorithm are described in the Standard ECMA-321 publication "Streaming Lossless Data Compression Algorithm—(SLDC), dated Jun. 1, 2001.

FIG. 1 illustrates a prior art implementation of a literal data symbol 2 that the SLDC algorithm outputs into the compressed data stream if there are no consecutive bytes following a data byte, so that the literal data byte is outputted, uncompressed. The literal data symbol 2 includes a zero bit 4 indicating that the symbol is a literal data symbol followed by the actual, uncompressed, data byte. FIG. 20 illustrates prior art operations to generate the literal for the literal symbol (at block 540) by outputting the unencoded data unit to include in the literal symbol (at block 542).

FIG. 2 illustrates a prior art implementation of a copy pointer symbol 10 that the SLDC algorithm outputs to represent multiple consecutive data bytes that match a same number of consecutive data bytes in the history buffer. The copy pointer symbol 10 includes a one bit 12 indicating that the symbol is a copy pointer, a match count field 14 indicating the number of matching consecutive bytes, and a displacement field 16 indicating an absolute memory address having the history buffer entry including the first byte of the matching consecutive bytes. FIG. 14 illustrates prior art operations to determine the displacement count in the copy pointer symbol by determining (at block 352) the absolute memory address having the entry in the history buffer with the start of the matching consecutive data bytes.

FIG. 3 shows a prior art implementation of a match count table 18 that is used to determine an encoding of a match count value as a number of bits, which indicates the number of matching consecutive bytes. The encoding of the match count value specified in the second column is included in the match count field 14 of the copy pointer symbol 10 being generated to represent the consecutive data bytes.

There is a need in the art to provide techniques to continue to improve the compression realized using compression algorithms, such as SLDC and others.

SUMMARY

Provided are a computer program product, system, method, and data structure for using variable length code tables to compress an input data stream to a compressed output data stream. A determination is made as to whether a number of consecutive data units in the input data stream match the number of consecutive data units in a history buffer of previously received data units in the input data stream. In response to determining that the number of consecutive data units in the input data stream match the number of consecutive data units in the history buffer, a copy pointer symbol is generated indicating the copy pointer symbol referencing previously received data units in the history buffer and indicating a location of a start of the consecutive data units in the history buffer. A determination is made from a variable length code table of an encoding of the number, wherein the variable length code table has: a first prefix of one bit which indicates that a next following one bit represents two or three data units; a second prefix of two bits which indicates that a next following one bit represents four or five data units; a third prefix of three bits which indicates that a next following one bit represents six or seven data units, and a fourth prefix of four bits which indicates that a next following one bit represents eight or nine data units. Indication is made in the generated copy pointer symbol the determined encoding of the number and the copy pointer symbol is outputted in the compressed output data stream.

Further provided are a computer program product, system, method, and data structure for using variable length code tables to compress an input data stream to a compressed output data stream. A determination is made as to whether a number of consecutive data units in the input data stream match the number of consecutive data units in a history buffer of previously received data units in the input data stream. In response to determining that there are no consecutive data units at a current position in the input data stream matching consecutive data units in the history buffer, a determination is made of a literal displacement count in a literal queue including the data unit at the current position. A determination is made from a variable length code table of an encoding of the determined literal displacement count. A literal symbol is outputted indicting a literal symbol followed by the determined encoding of the literal displacement count in the compressed output data stream in the computer storage.

BRIEF DESCRIPTION OF THE DRAWINGS

FIG. 1 illustrates a prior art implementation of a literal data symbol.

FIG. 2 illustrates a prior art implementation of a copy pointer symbol.

FIGS. 7 and 8 illustrate embodiments of displacement count variable length code tables.

FIG. 9 illustrates an embodiment of a minimum displacement count variable length code table.

FIG. 10 illustrates an embodiment of a match count variable length code table.

FIG. 11 illustrates an embodiment of a literal variable length code table.

FIG. 12 illustrates an embodiment of a control symbol value table.

DETAILED DESCRIPTION

Described embodiments generate copy pointer symbols and literal data symbols from data units, such as bytes and symbols, in an input data stream to output into the compressed output data stream using variable length code tables, where the values in the table may be determined using Huffman coding techniques. The data units that are subject to processing in the input data stream may comprise data bytes and control symbols.

Figure 3:
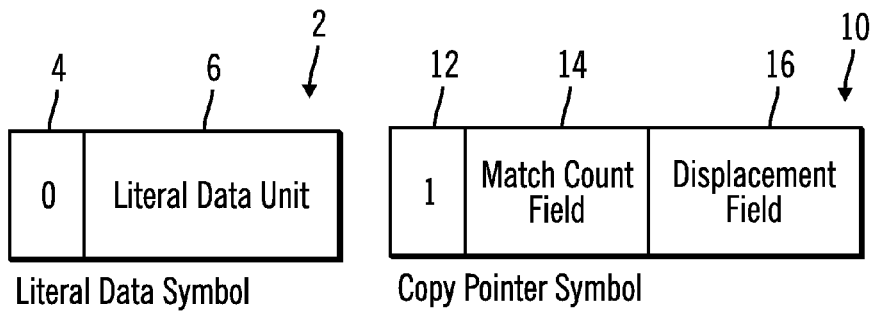
FIG. 3 illustrates a prior art implementation of a match count encoding table.
Figure 4:
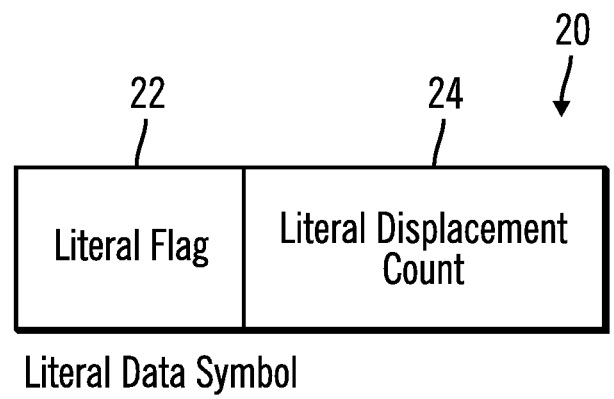
FIG. 4 illustrates an embodiment of a literal data symbol.

FIG. 4 provides an embodiment of a literal data symbol 20 having a literal flag 22, such as a bit having a value of zero, identifying the symbol 20 as a literal symbol and a literal displacement count 24 identifying a location/index in a literal queue having the uncompressed data unit in the input data stream.

Figure 5:
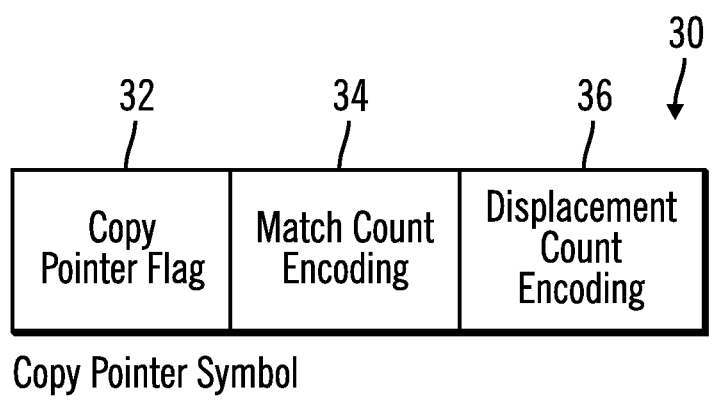
FIG. 5 illustrates an embodiment of a copy pointer symbol.

FIG. 5 provides an embodiment of a copy pointer symbol 30 having a copy pointer flag 32, such as a bit having a value of 1, identifying the symbol 30 as a copy pointer, a match count encoding 34 comprising an encoding of a number of data units (e.g. bytes) in the input data stream replaced by the copy pointer 30 in the output data stream, and a displacement count encoding 36 comprising an encoding of a relative location in the history buffer at which the consecutive data units start. The fields shown in FIG. 5 may be output in a different order than shown.

Figure 6:
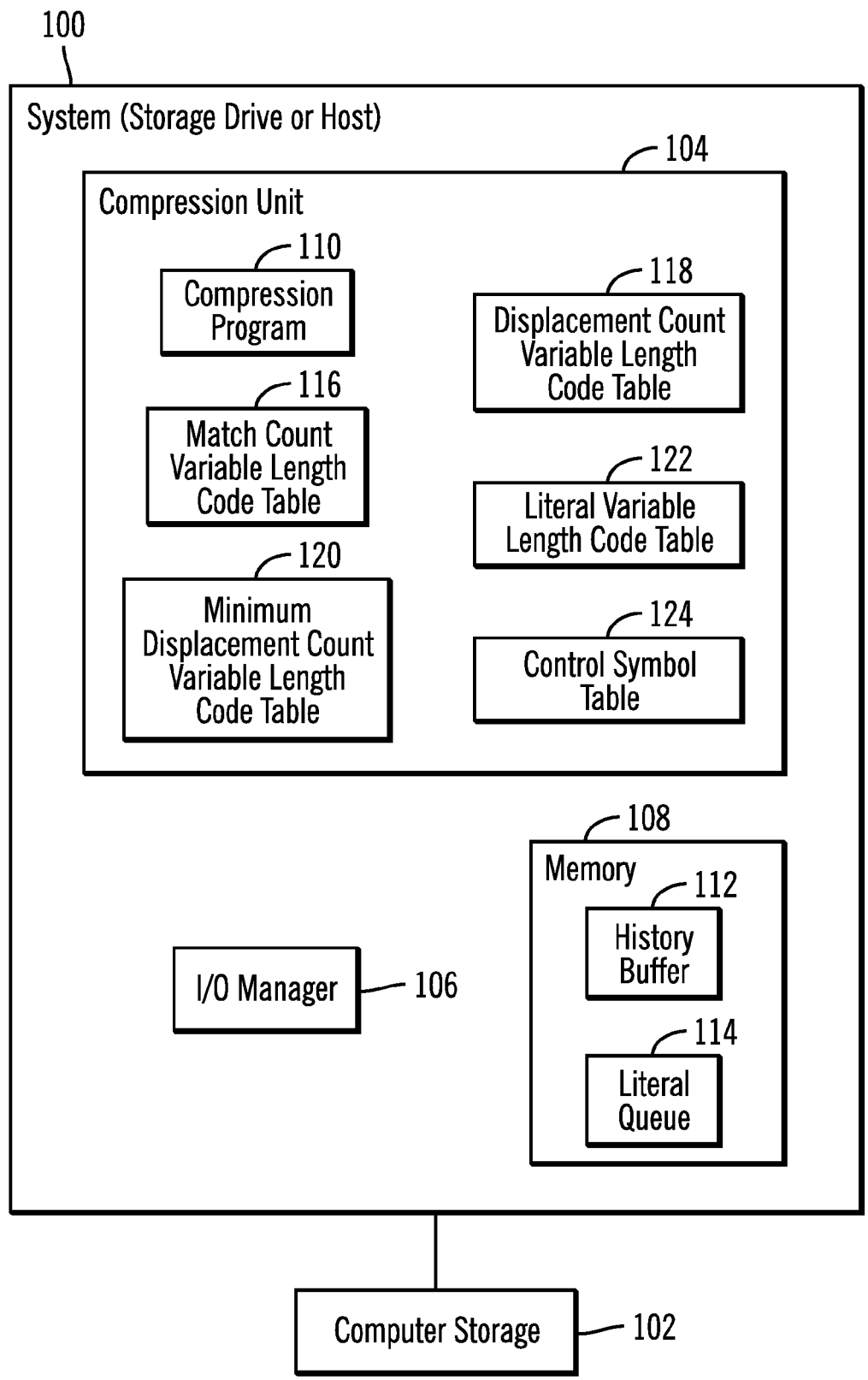
FIG. 6 illustrates an embodiment of a system in which described embodiments are implemented.

FIG. 6 illustrates an embodiment of a system 100 coupled to a computer storage 102. The system 100 includes a compression unit 104 to compress data written to the computer storage 102 and decompress data read from the computer storage 102, an Input/Output (I/O) manager 106 to read and write data to the computer storage 102, and a memory 108. The compression unit 104 includes a compression program 110 to perform compression and decompression operations using a history buffer 112 and literal queue 114 in the memory 108. The history buffer 112 stores incoming data units for compression and decompression, where during compression, input data units are replaced by a copy pointer that references consecutive previously processed data units (e.g. bytes) in the history buffer 112.

The literal queue 114 comprises a data structure storing all possible input data units values to be referenced in the literal displacement count 24 field in the literal data symbol 20 that is output into the compressed data stream. The literal queue 114 may comprise a Most Recently Used (MRU) buffer, such as a content addressable memory (CAM). In one embodiment, where each data unit to be output into the compression stream comprises a byte, the literal queue 16 may be 256 bytes, having one entry for each possible byte value. In this way, the literal data symbol 20 includes an index location into the literal queue 114 instead of the data byte.

The compression unit 104 includes a match count variable length code table 116, a displacement count variable length code table 118, a minimum displacement count variable length code table 120, a literal variable length code table 122, and a control symbol table 124. In certain embodiments, the code tables 116, 118, 120, and 122 may include a prefix indicating a number of following bits used to indicate the values being encoded. In certain embodiments, the variable length code tables 116, 118, 120, 122 may comprise Huffman tables that provide encodings of the values having a smaller average output size, than the unencoded codes, according to a probability distribution of the values realized by the compression algorithm.

The compression program 110 uses tables 116, 118, 120, 122, and 124 when compressing and decompressing symbols. The match count variable length code table 116 is used to encode the match count field 34, which indicates a number of consecutive data units, e.g. bytes, in the input data stream replaced by the copy pointer symbol 30. The displacement count variable length code table 118 is used to encode a relative displacement count in the history buffer 112 having the starting consecutive data unit included in the field 36 (FIG. 5) of the copy pointer symbol 30. The minimum displacement count variable length code table 120 is used to encode a displacement count when there are a minimum number of consecutive data units, such as two bytes, that are only found within a predetermined displacement count, such as within 1024 displacement count values. In certain embodiments, the compression program 110 may only use a copy pointer for a minimum number of consecutive data units, such as two consecutive data units, if the displacement count where the consecutive data units start in the history buffer 112 is within a predetermined displacement count, such as in the first 1024 entries in the history buffer 112. This allows use of a smaller code to represent the displacement count that has a smaller value than the total possible displacement count values for the history buffer 124, e.g. 16 KB or 8 KB.

The literal variable length code table 122 is used to encode the literal displacement count in the literal queue 114 having the literal value to include in the field 24 of a literal data symbol 20. The control symbol table 124 provides values for control symbols that are inserted into the output data stream to allow the compression program 110 to decompress the data symbols.

The computer storage 102 may comprise storage media implemented in one or more storage devices known in the art, such as interconnected hard disk drives (e.g. configured as a DASD, RAID, JBOD, etc.), solid state storage devices (e.g. EEPROM (Electrically Erasable Programmable Read-Only Memory), flash memory, flash disk, storage-class memory (SCM)), electronic memory, magnetic tape media, tape cartridges, etc. In one embodiment, the computer storage 102 may comprise a Linear Tape Open (LTO) tape cartridge. The memory 108 may be comprised of one or more volatile or non-volatile memory devices known in the art.

In FIG. 6, the compression program 110 and I/O manager 106 may comprise software programs in a memory, such as memory 108, which also includes the tables 116, 118, 120, 244, and 124, executed by a processor. In an alternative embodiment, the compression program 110, I/O manager 106, and tables 116, 118, 120, 244, and 124 may be implemented in a hardware component, such as a dedicated integrated circuit, e.g. Application Specific Integrated Circuit (ASIC), expansion card, etc., in the storage server 100 or implemented as a combination of hardware or software.

In one embodiment, the system 100 may comprise a storage drive, such as a tape drive, that interfaces with removable storage 102 units, such as tape cartridges, hard disk drives, flash memory devices, optical storage, etc. In a further embodiment, the system 100 may comprise a host system which interfaces further with a storage drive to interface with computer storage 102.

The compression unit 104 may be designed to perform compression operations as part of an SLDC algorithm that compresses and decompresses data for an LTO tape cartridge.

FIG. 7 illustrates a table 150 comprising an embodiment of the displacement count variable length code table 118 in an embodiment when the history buffer 112 is 16 kilobytes (KB). Table 150 provides different encodings of the relative displacement count into the history buffer 112 for different ranges of displacement counts. In table 150, entry 152 has a first prefix value of 3 bits which indicates that a next following 8 bits indicates a relative displacement count of 0 through 255 in the history buffer 112; entry 154 has a second prefix value of four bits which indicates that a next following 8 bits indicates a relative displacement count of 256 through 511 in the history buffer 112; entry 156 has a third prefix value of four bits which indicates that a next following 9 bits indicates a relative displacement count of 512 through 1023 in the history buffer 112; entry 158 has a fourth prefix value of three bits which indicates that a next following 10 bits indicates a relative displacement count of 1024 through 2047 in the history buffer 112; entry 160 has a fifth prefix value of two bits which indicates that a next following 11 bits indicates a relative displacement count of 2048 through 4095 in the history buffer 112; entry 162 has a sixth prefix value of two bits which indicates that a next following 12 bits indicates a relative displacement count of 4096 through 8191 in the history buffer 112; and entry 164 has a seventh prefix value of 2 bits which indicates that a next following 13 bits indicates a relative displacement count of 8192 through 16385 in the history buffer 112.

FIG. 8 illustrates a table 170 comprising an embodiment of the displacement count variable length code table 118 in an embodiment when the history buffer 112 is 8 kilobytes (KB). Table 170 provides different encodings of the relative displacement count into the history buffer 112 for different ranges of displacement counts. In table 170, entry 172 has a first prefix value of 2 bits which indicates that a next following 8 bits indicates a relative displacement count of 0 through 255 in the history buffer 112; entry 174 has a second prefix value of three bits which indicates that a next following 8 bits indicates a relative displacement count of 256 through 511 in the history buffer 112; entry 176 has a third prefix value of three bits which indicates that a next following 9 bits indicates a relative displacement count of 512 through 1023 in the history buffer 112; entry 178 has a fourth prefix value of three bits which indicates that a next following 10 bits indicates a relative displacement count of 1024 through 2047 in the history buffer 112; entry 180 has a fifth prefix value of three bits which indicates that a next following 11 bits indicates a relative displacement count of 2048 through 4095 in the history buffer 112; and entry 182 has a sixth prefix value of two bits which indicates that a next following 12 bits indicates a relative displacement count of 4096 through 8191 in the history buffer 112.

FIG. 9 illustrates a table 190 comprising an embodiment of the minimum displacement count variable length code table 120 in an embodiment when the minimum consecutive number of bytes is two and when a copy pointer 30 is only used to represent two consecutive bytes if the displacement count in the history buffer 112 is within a predetermined value, such as within the first 1024 values. In table 190, entry 192 has a first prefix value of 1 bit which indicates that a next following 8 bits indicates a relative displacement count of 0 through 255 in the history buffer 112; entry 194 has a second prefix value of two bits which indicates that a next following 8 bits indicates a relative displacement count of 256 through 511 in the history buffer 112; and entry 196 has a third prefix value of two bits which indicates that a next following 9 bits indicates a relative displacement count of 512 through 1023 in the history buffer 112. In certain embodiments to improve compression for a two byte copy pointer, prefix values for data units 0 through 1023 in the displacement count variable length code tables 150 and 170, used to encode all possible displacement counts, has a greater number of bits than the first, second, and third prefix values in the minimum displacement count variable length code table 190 to produce smaller average encodings of the displacement count values for two byte copy pointers 30.

FIG. 10 illustrates a table 200 comprising an embodiment of the match count variable length code table 116 to encode a match count that may indicate a match count of 2 to 271 consecutive bytes (data units) represented by the copy pointer 30. In table 200, entry 202 has a one bit first prefix followed by one bit to represent two or three bytes (data units); entry 204 has a two bit second prefix followed by one bit to represent four or five data units; entry 206 has a three bit third prefix followed by one bit to represent six or seven data units; entry 208 has a four bit fourth prefix followed by one bit to represent eight or nine data units; entry 210 has a five bit fifth prefix followed by one bit to represent ten or eleven data units; entry 212 has a six bit sixth prefix followed by two bits to represent twelve through fifteen data units; entry 214 has a seven bit seventh prefix followed by 3 bits to represent 16 through 23 data units; entry 216 has an eight bit eighth prefix followed by three bits to represent 24 through 31 data units, and entry 218 has an eight bit ninth prefix followed by 8 bits to represent 32 through 271 data units.

FIG. 11 illustrates a table 260 comprising an embodiment of the literal variable length code table 122 to encode a literal displacement count in the literal queue 114 for a literal data symbol 24 to reduce the number of bits likely needed to express the literal value. In table 260, entry 262 has a first prefix value of 1 bit which indicates that a next following six bits indicates one of literal displacement counts 0 through 63; entry 264 has a second prefix value of two bits which indicates that a next following six bits indicates one of literal displacement counts 64 through 127; and entry 266 has a third prefix value of two bits which indicates that a next following 7 bits indicates one of literal displacement counts 128 through 255.

FIG. 12 illustrates a table providing an embodiment of the control symbol table 124 that provides codes or values to output to represent different control symbols.

Figure 13:
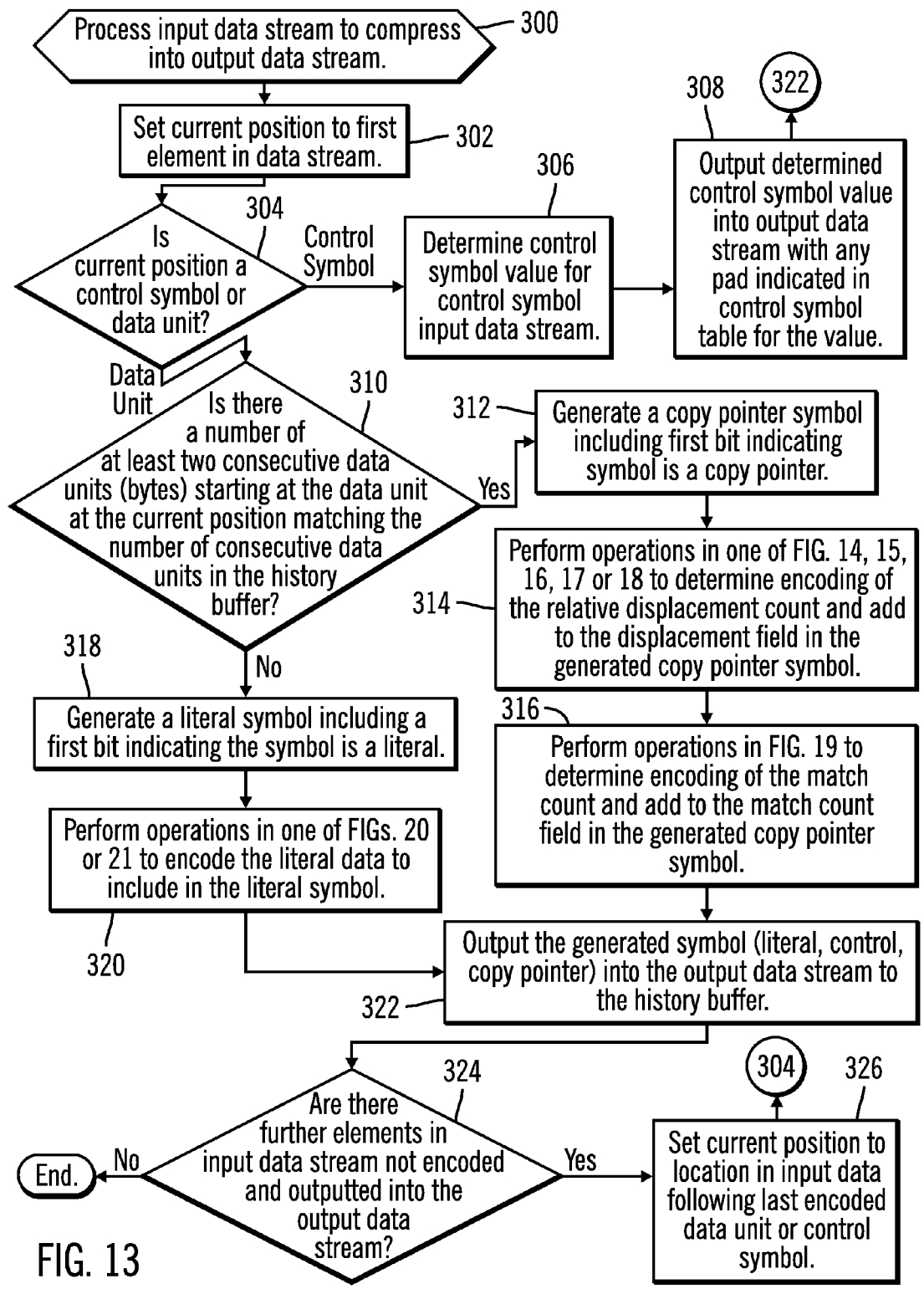
FIG. 13 illustrates an embodiment of operations to compress symbols in an input data stream.

FIG. 13 illustrates an embodiment of operations performed by the compression program 120 to process an input data stream. Upon initiating the operation to process (at block 300)

the input data stream to compress, the compression program 110 sets (at block 302) a current position to a first element in the data stream (data unit or control symbol). If (at block 304) the current position is at a control symbol, then the compression program 110 determines (at block 306) a control symbol value from the control symbol table 124 for the control symbol in the input data stream. The determined control symbol value is output (at block 308) into the output data stream with any pad indicated in the control symbol table 124 for the value.

If (at block 304) the symbol at the current position is a data symbol, then the compression program 110 determines (at block 310) whether there are a number of at least two consecutive data units (bytes) starting at the data unit at the current position which matches the number of consecutive data units in the history buffer 112. If there are consecutive data units from the current position in the input data stream matching consecutive data units in the history buffer 112, then the compression program 110 generates (at block 312) a copy pointer symbol 30 including a copy pointer flag 32, such as a first bit value of 1, indicating the symbol is a copy pointer. The compression program 110 is coded to perform (at block 314) the operations in one of FIG. 14, 15, 16, 17, or 18 to determine an encoding of the relative displacement count in the history buffer 112 at which the consecutive data units start. This encoded displacement count is added to field 36 of the copy pointer symbol 30 (FIG. 5) being generated. The compression program 110 further performs (at block 316) the operations in FIG. 19, using the table in FIG. 1 or the match count variable length code table 116, 200 (FIG. 10), to determine encoding of the match count indicating the number of consecutive bytes starting from the displacement count represented by the copy pointer 30. The encoded match count value is added to field 34 in the copy pointer symbol 30.

If (at block 310) the history does not have a number of consecutive data units matching consecutive data units from the current position, then the compression program 110 generates (at block 318) a literal data symbol 20 including a first bit indicating the symbol is a literal, e.g. zero bit. The compression program 110 is coded to perform operations (at block 320) in one of FIG. 20 or 21 to encode the literal data to include in the literal data symbol 20.

After outputting (at block 322) the generated literal data symbol 20 (from block 320), a copy pointer 30 (from block 316) or control symbol (from block 308), the compression program 110 determines (at block 324) whether there are further elements in the input data stream not encoded and output into the output data stream. If not, control ends. Otherwise, if there are elements to process, the compression program 110 sets (at block 326) the current position to the next unencoded element in the input data stream and proceeds to block 304 to encode further elements to reduce the number of bytes needed to express the data in the input data stream.

As mentioned, FIGS. 14-18 provide different embodiments of operations performed by the compression program 110 for encoding the relative displacement count in the history buffer 112 of the start of the consecutive data units being replaced by the copy pointer 30 in the output data stream.

Figure 14:
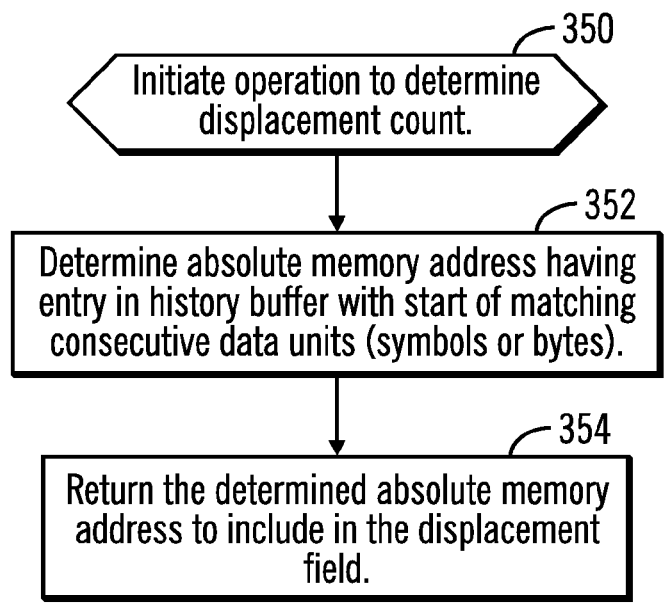
FIG. 14 illustrates a prior art implementation to determine a displacement count field in a copy pointer symbol.

FIG. 14 provides a prior art technique to determine an absolute displacement count to include in the copy pointer 30. Upon initiating the operation to determine (at block 350) the displacement count 30, the compression program 110 determines (at block 352) an absolute memory address in the memory 108 having the entry in the history buffer 112 with the start of the matching consecutive data units. The determined absolute displacement count, i.e. memory address, is returned (at block 354) to include in the displacement count field 36 of the copy pointer 30.

Figure 15:
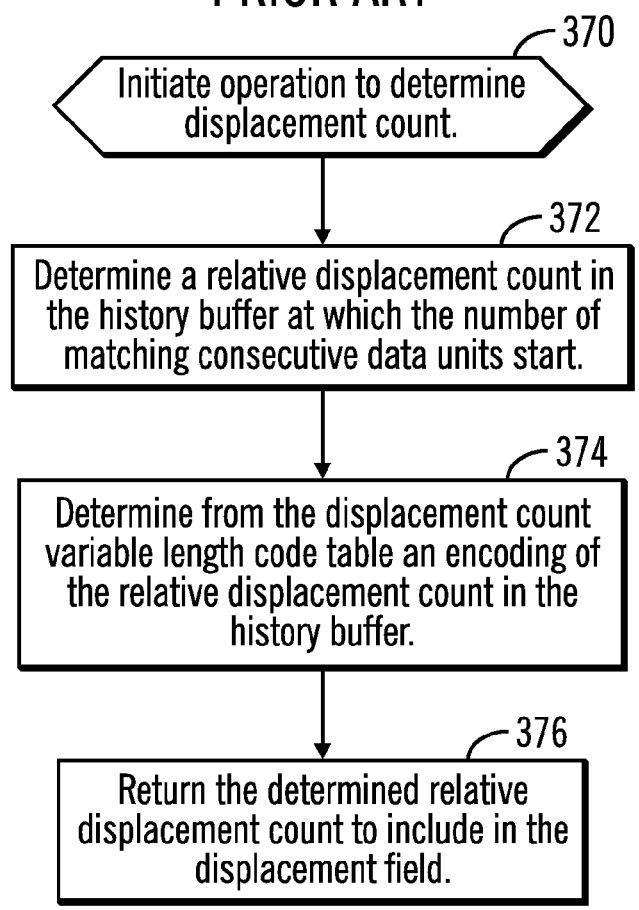
FIGS. 15, 16, 17, and 18 illustrate embodiments of operations to determine a displacement count field in a copy pointer symbol.

With respect to FIG. 15, to initiate (at block 370) the operation to determine a relative displacement count into the history buffer 112, the compression program 110 determines (at block 372) a relative displacement count in the history buffer 112 at which the number of matching consecutive data units start. The compression program 110 then determines (at block 374) from the displacement count variable length code table 118 an encoding of the relative displacement count in the history buffer 112 and returns (at block 376) the determined relative displacement count to include in field 36 of the copy pointer symbol 30 (FIG. 5).

Figure 16:
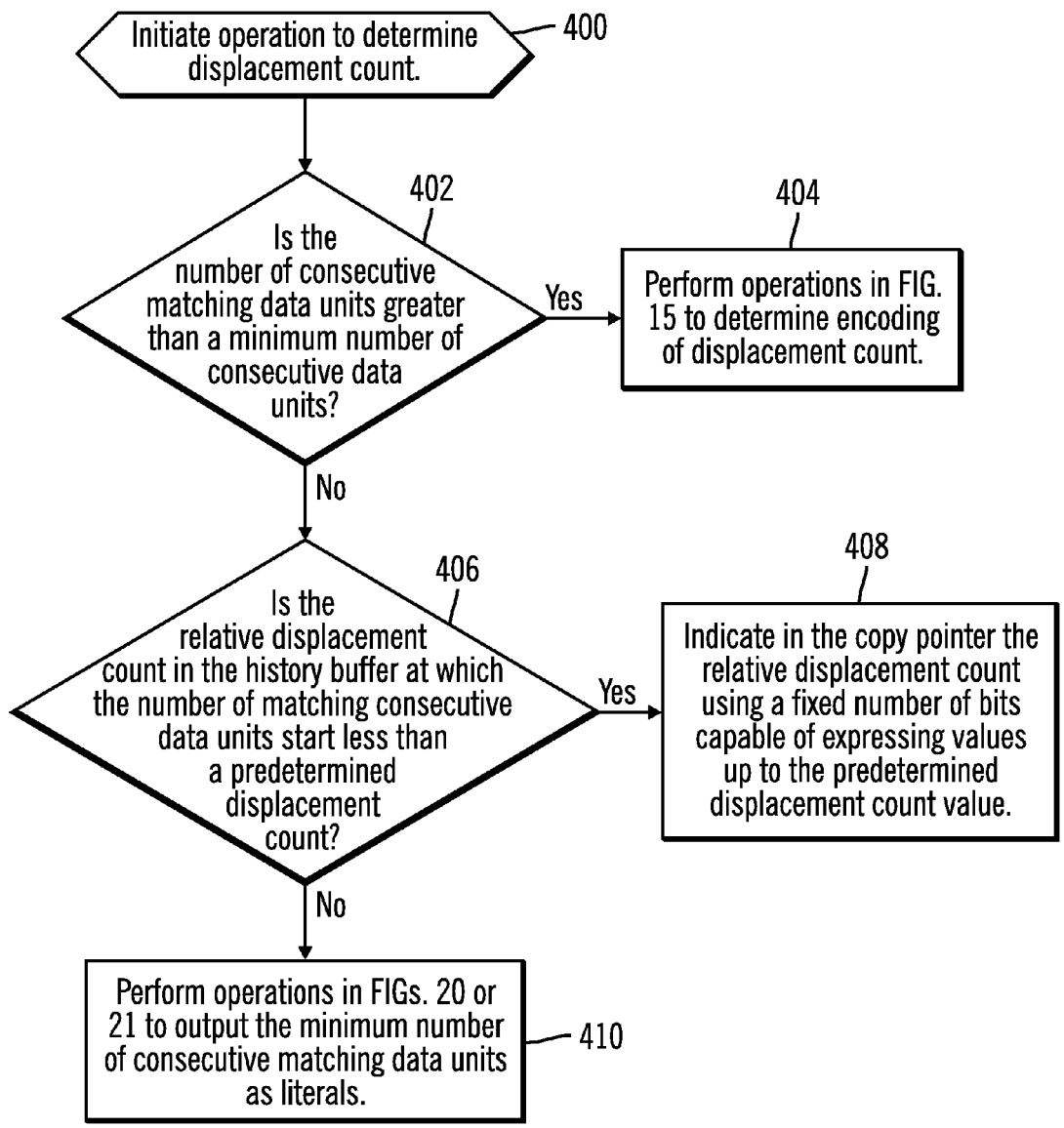
Figure 17:
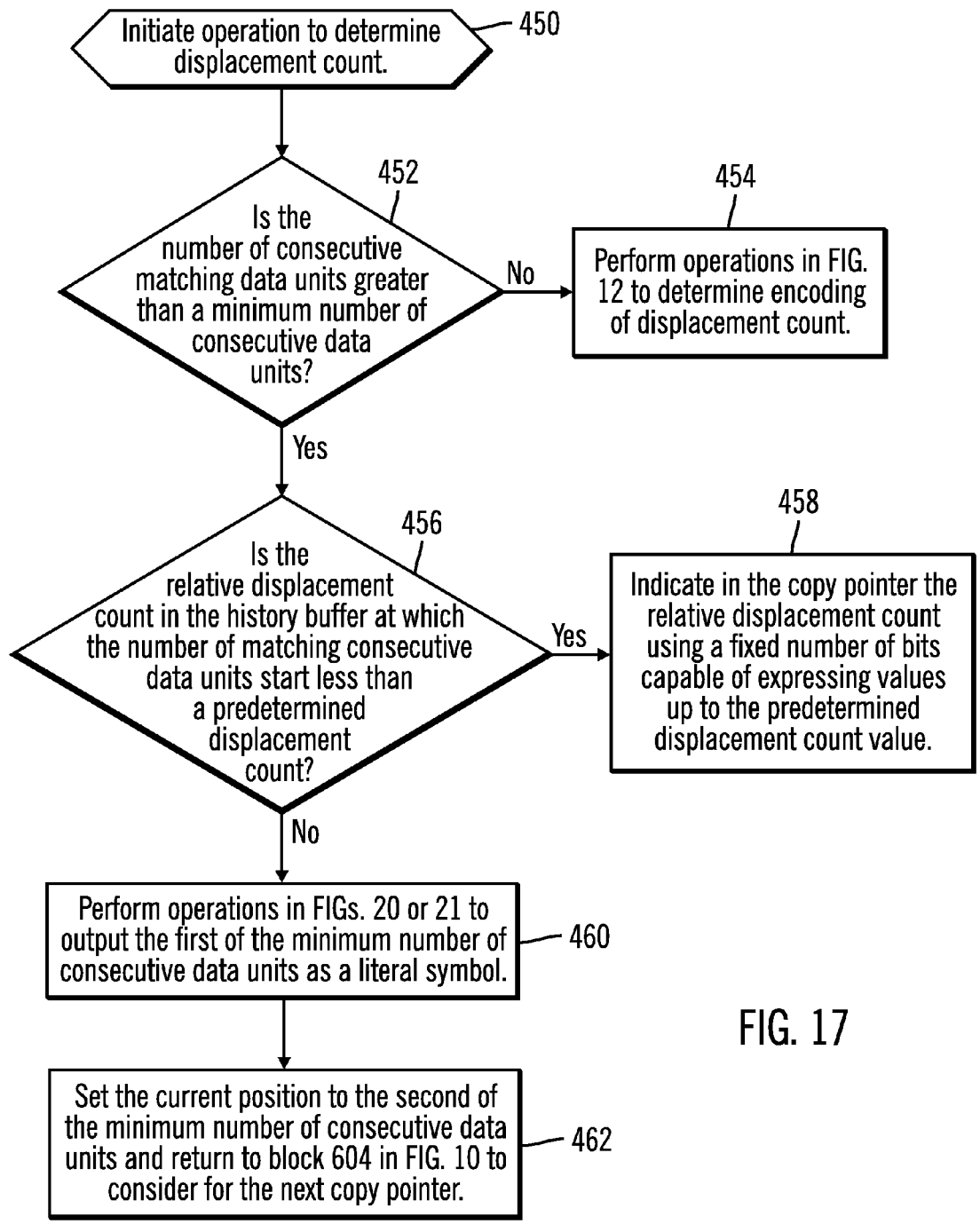
Figure 18:
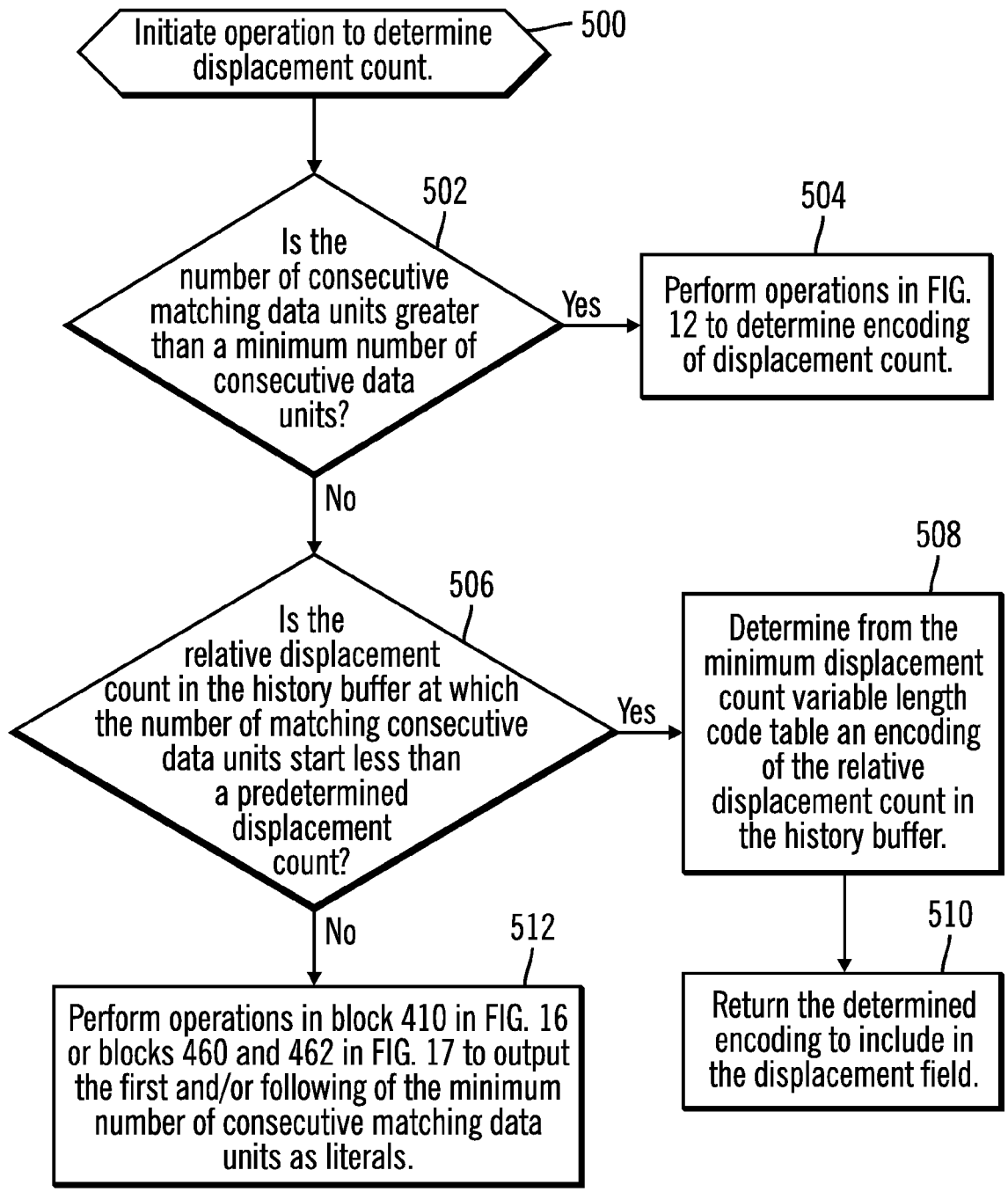

FIGS. 16, 17, and 18 provide different embodiments of operations implemented by the compression program 110 to determine whether to generate a copy pointer symbol 30 based on whether the number of consecutive data units to replace is greater than a minimum number of consecutive data units, in order to ensure that using a copy pointer for a minimum number of consecutive data units results in compression benefits. In one embodiment, the minimum number comprises two consecutive bytes.

With respect to FIG. 16, upon initiating (at block 400) the operation to determine the displacement count field 36 in the copy pointer 30, the compression program 110 determines (at block 402) whether the number of consecutive matching data units is a minimum number of consecutive data units. If (at block 402) the number of consecutive data units is greater than the minimum number, then the compression program 110 performs (at block 404) the operations in FIG. 15 to determine encoding of displacement count. If (at block 402) the number of matching consecutive data units is equal to the minimum number, then the compression program 110 determines (at block 406) whether the relative displacement count in the history buffer 12 at which the number of matching consecutive data units start is less than a predetermined displacement count. In certain embodiments, the predetermined displacement count is set to a low enough value to ensure to limit the amount of bits used to express the displacement count encoding 36 so that use of the copy pointer symbol 30 will compress data as opposed to just outputting a literal data symbol 20. For instance, if the minimum number is two bytes, then the predetermined displacement count may comprise 1024, limiting the relative displacement count 36 to ten bits needed to express all 1024 displacement counts.

If (at block 406) the relative displacement count is within the predetermined displacement count, then the compression program 110 indicates (at block 408) in the copy pointer 30 the relative displacement count 36 using a fixed number of bits capable of expressing values up to the predetermined displacement count value, such as 10 bits for a minimum two bytes of consecutive bytes. If (at block 406) the relative displacement count is greater than the predetermined displacement account, then the compression program 110 performs (at block 410) the operations in FIG. 20 or 21 to output the minimum number of consecutive matching data units as literal symbols 20 (FIG. 4).

With respect to FIG. 17, the operations at blocks 450, 452, 454, 456, and 458 are the same as operations 400, 402, 404, 406, and 408, respectively, described with respect to FIG. 16. However, in FIG. 17, if (at block 456) the relative displacement count is not greater than the predetermined displacement account, then the compression program 110 performs (at block 460) the operations in FIG. 20 or 21 to output the first of the minimum number of consecutive matching data units as a literal data symbol 20 and then sets (at block 462) the current position to the second of the minimum number of consecutive data units and return to block 304 in FIG. 10 to consider for the next copy pointer 30 from the new current position.

With respect to FIG. 18, the operations at blocks 500, 502, 504 and 506 are the same as operations 400, 402, 404, and 406, respectively, described with respect to FIG. 16. However, in FIG. 18, if (at block 506) the relative displacement count is greater than the predetermined displacement count, then the compression program 110 determines (at block 508) from the minimum displacement count variable length code table 120, 150, 170 an encoding of the relative displacement count in the history buffer 112. The compression program 110 returns (at block 510) the determined encoding to include in the displacement field 36 of the copy pointer symbol 30 (FIG. 5). If (at block 506) the relative displacement count is not greater than the predetermined displacement count, then the compression program 110 performs (at block 512) the operations in block 410 in FIG. 16 or, alternatively, blocks 460 and 462 in FIG. 17 to output the first and/or following of the minimum number of consecutive matching data units as literals.

In performing the operations in FIG. 15, 16, 17, or 18 if the compression program 110 determines that there are multiple instances of the number of consecutive data units in the history buffer 112 matching the number of the at least two consecutive data units in the input stream, thus providing multiple eligible relative displacement counts in the history buffer 12, then the compression program 110 may select the lowest value relative displacement count to use.

Figure 19:
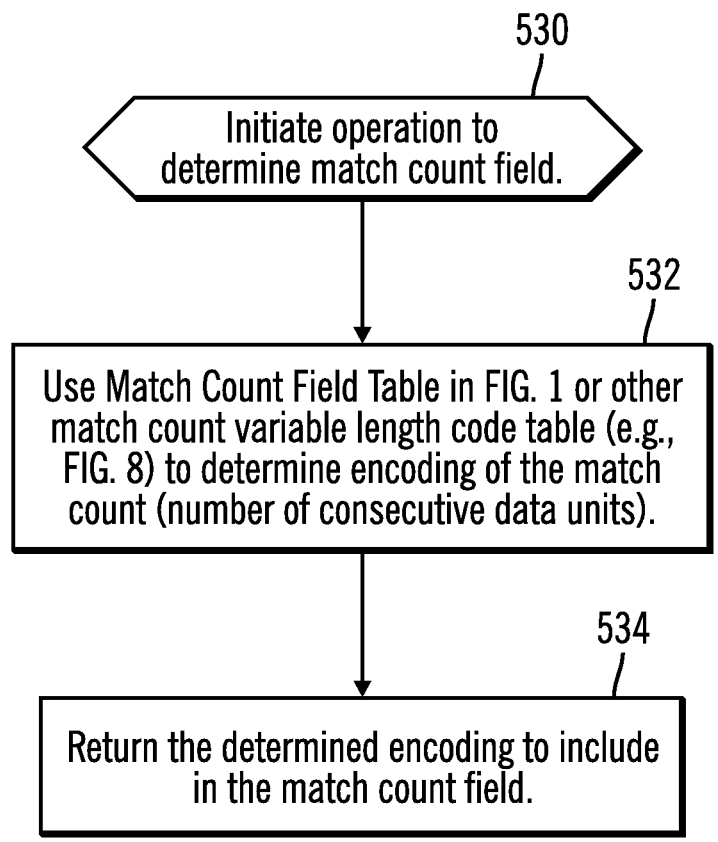
FIG. 19 illustrates an embodiment of operations to determine a match count field in a copy pointer symbol.

FIG. 19 provide embodiments of operations coded in the compression program 110 to generate an encoding or value for the match count field 34 in the copy pointer symbol 30. With respect to FIG. 19, upon initiating the operation (at block 530) to determine the match count field 34, the compression program 110 uses the Match Count Field Table in FIG. 1 or another match count variable length code table 116, such as table 200 in FIG. 10, to determine the encoding of the match count (number of matching consecutive data units in the history buffer 112). The determined encoding of the match count field is returned (at block 534) to include in the match count field 34 in the copy pointer symbol 30 (FIG. 5) being generated.

Figure 20:
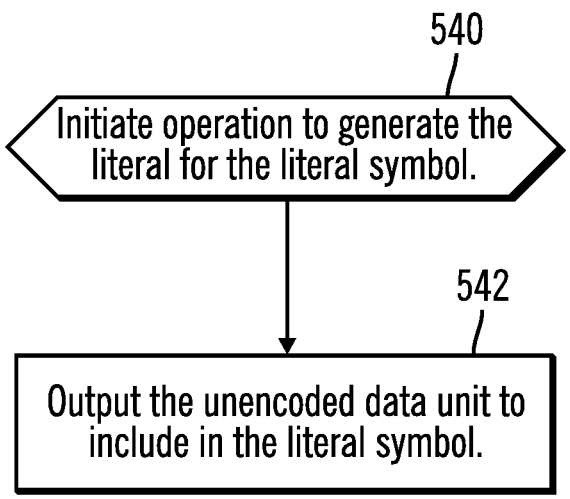
FIG. 20 illustrates a prior art implementation to generate the literal field for a literal symbol.
Figure 21:
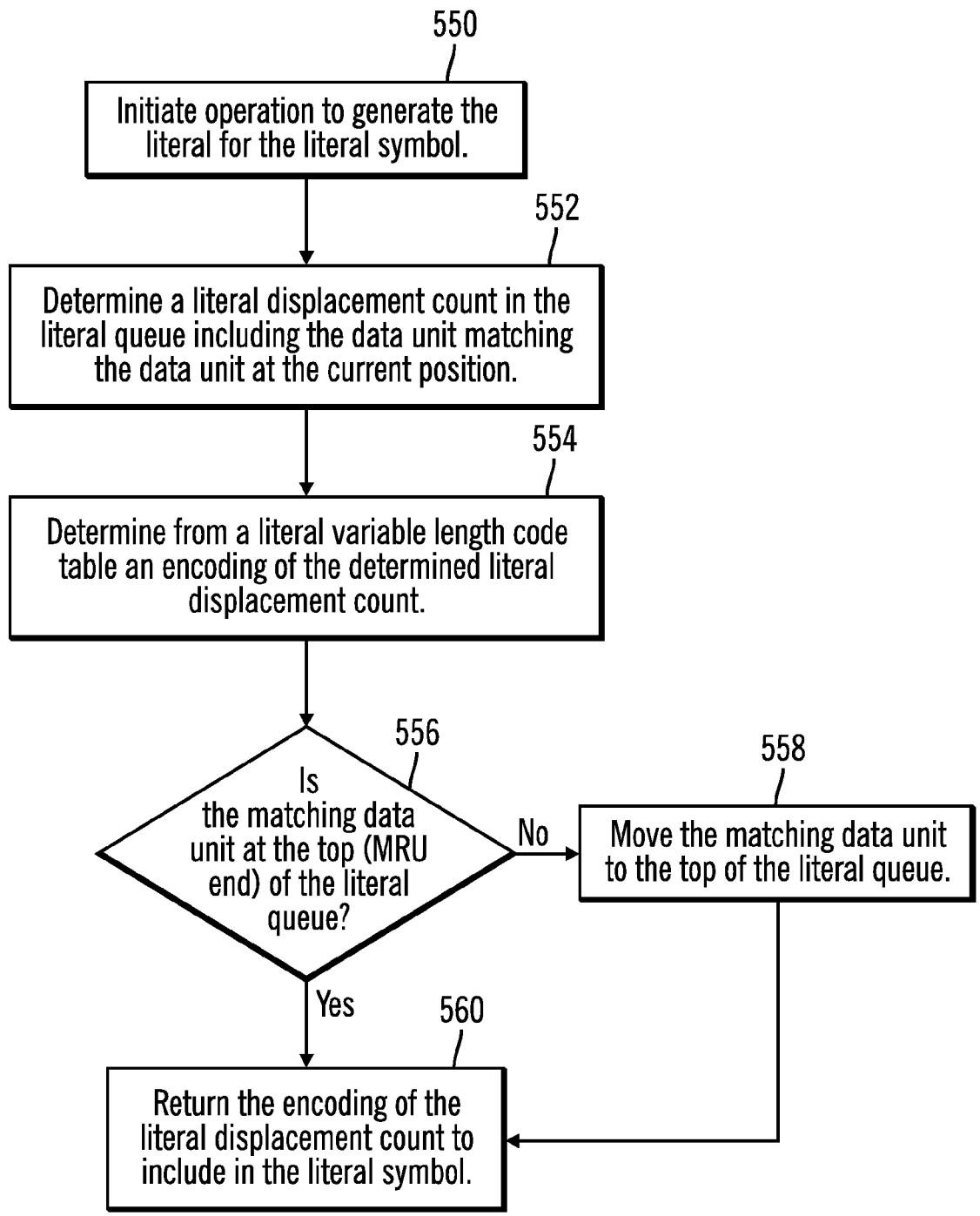
FIG. 21 illustrates an embodiment of operations to generate the literal field for a literal symbol.

FIGS. 20 and 21 provide embodiments of operations coded in the compression program 110 to generate an encoding or value for the literal data symbol 24.

In one embodiment, with respect to FIG. 20, the compression program 110 initiates (at block 540) the operation to generate the literal for the literal data symbol 20 and outputs (at block 542) the unencoded data unit, e.g. byte, in the input data stream to include in the literal data symbol, such as shown in FIG. 2.

In an alternative embodiment, with respect to FIG. 21, the compression program initiates (at block 550) the operation to generate the literal displacement count 24 for the literal data symbol 20 by determining a literal displacement count in the literal queue 114 including the data unit matching the data unit at the current position in the input data stream. The compression program 110 then determines (at block 554) from the literal variable length code table 122 an encoding of the determined literal displacement count to include in the field 24 of the literal data symbol 20 (FIG. 4). If (at block 556) the matching data unit in the literal queue 114 is not at the top, e.g. MRU end, of the literal queue 114, then the compression program 110 moves (at block 558) the matching data unit to the top of the literal queue 114. In one embodiment, the compression program 110 may move the data unit in the literal queue 114 to the top by shifting all bytes ahead of the data unit that matches one so that the matching data unit in the literal queue 114 is overwritten and the matching data unit is then placed at the top of the literal queue 114. After moving the data unit to the top of the literal queue 114 (from block 558) or if the data unit is already at the top of the literal queue 114 (from the yes branch of block 556), the compression program 110 returns (at block 560) the encoding of the literal displacement count to include in the field 24 of the literal data symbol 20 (FIG. 4) being generated.

Described embodiments provide compression techniques to encode fields in a copy pointer, such as the match count field and displacement count and to encode the literal data symbol with a code referencing a location in a literal data queue to realize further improvements in compression of an input data stream.

CONCLUSION

The described operations may be implemented as a method, apparatus or computer program product using standard programming and/or engineering techniques to produce software, firmware, hardware, or any combination thereof. Accordingly, aspects of the embodiments may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the embodiments may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 22:
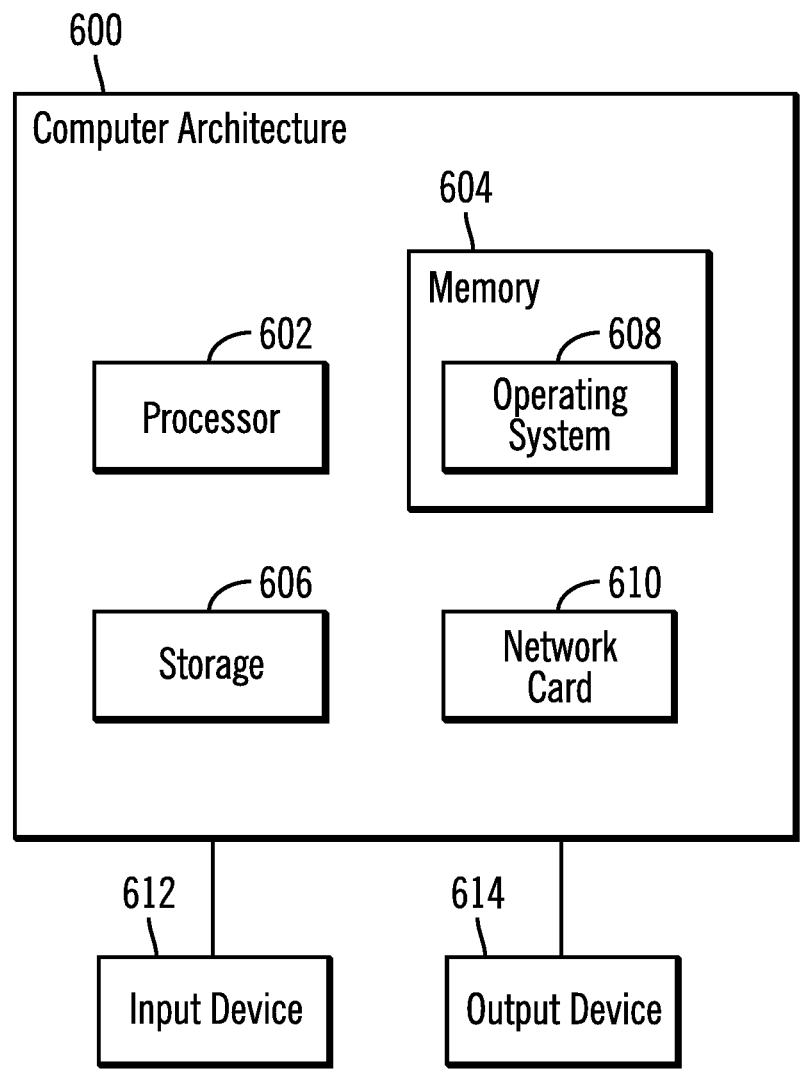
FIG. 22 illustrates a computer architecture in which described embodiments may be implemented.

FIG. 22 illustrates an embodiment of a computer architecture 600 that may be implemented at the system 100 in FIG. 1. The architecture 600 may include a processor 602 (e.g. a microprocessor), a memory 604 (e.g. a volatile memory device), and storage 606 (e.g. a non-volatile storage, such as magnetic disk drives, optical disk drives, a tape drive, etc.). The storage 606 may comprise an internal storage device or an attached or network accessible storage. Programs, including an operating system 608 and the compression program 110 and I/O manager 106 in the storage 606 are loaded into the memory 604 and executed by the processor 602. The memory 604 may further include the tables 116, 118, 120, 22, and 124. The architecture further includes a network card 610 to enable communication with a network. An input device 612 is used to provide user input to the processor 602, and may include a keyboard, mouse, pen-stylus, microphone, touch sensitive display screen, or any other activation or input mechanism known in the art. An output device 614 is capable of rendering information transmitted from the processor 602, or other component, such as a display monitor, printer, storage, etc.

The terms "an embodiment", "embodiment", "embodiments", "the embodiment", "the embodiments", "one or more embodiments", "some embodiments", and "one embodiment" mean "one or more (but not all) embodiments of the present invention(s)" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

A description of an embodiment with several components in communication with each other does not imply that all such components are required. On the contrary a variety of optional components are described to illustrate the wide variety of possible embodiments of the present invention.

Further, although process steps, method steps, algorithms or the like may be described in a sequential order, such processes, methods and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments of the present invention need not include the device itself.

The illustrated operations of FIGS. 13-21 show certain events occurring in a certain order. In alternative embodiments, certain operations may be performed in a different order, modified or removed. Moreover, steps may be added to the above described logic and still conform to the described embodiments. Further, operations described herein may occur sequentially or certain operations may be processed in parallel. Yet further, operations may be performed by a single processing unit or by distributed processing units.

The foregoing description of various embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims herein after appended.

What is claimed is:

1. A computer program product for compressing an input data stream to produce a compressed output data stream, the computer program product comprising a computer readable storage medium having computer readable program code embodied therein that is executed to perform operations, the operations comprising:

determining whether a number of consecutive data units in the input data stream match the number of consecutive data units in a history buffer of previously received data units in the input data stream;

in response to determining that the number of consecutive data units in the input data stream match the number of consecutive data units in the history buffer, generating a copy pointer symbol indicating the copy pointer symbol referencing previously received data units in the history buffer and indicating a location of a start of the consecutive data units in the history buffer;

determining from a variable length code table an encoding of the number, wherein the variable length code table has: a first prefix of one bit which indicates that a next following one bit represents two or three data units; a second prefix of two bits which indicates that a next following one bit represents four or five data units; a third prefix of three bits which indicates that a next following one bit represents six or seven data units, and a fourth prefix of four bits which indicates that a next following one bit represents eight or nine data units;

indicating in the generated copy pointer symbol the determined encoding of the number; and outputting the copy pointer symbol in the compressed output data stream.

2. The computer program product of claim 1, wherein the variable length code table further includes: a fifth prefix of five bits followed by one bit which represents ten or eleven data units; a sixth prefix of six bits followed by two bits which represents twelve through fifteen data units; a seventh prefix of seven bits followed by three bits which represents 16 through 23 data units; an eighth prefix of eight bits followed by three bits which represents 24 through 31 data units; and a ninth prefix of eight bits followed by eight bits which represents 32 through 271 data units.

3. The computer program product of claim 1, wherein the variable length code table comprises a first variable length code table, and wherein the operations further comprise:

determining a displacement count in the history buffer at which the number of matching consecutive data units start; and determining from a second variable length code table an encoding of the displacement count in the history buffer, wherein the displacement count included in the copy pointer symbol comprises the encoding of the displacement count.

4. A computer program product for compressing an input data stream to produce a compressed output data stream, the computer program product comprising a computer readable storage medium having computer readable program code embodied therein that executes to perform operations, the operations comprising:

determining whether a number of consecutive data units in the input data stream match the number of consecutive data units in a history buffer of previously received data units in the input data stream;

in response to determining that there are no consecutive data units at a current position in the input data stream matching consecutive data units in the history buffer, performing:

determining a literal displacement count in a literal queue including the data unit at the current position;

determining from a variable length code table an encoding of the determined literal displacement count; and outputting a literal symbol indicting a literal symbol followed by the determined encoding of the literal displacement count in the compressed output data stream in the computer storage.

5. The computer program product of claim 4, wherein the operations further comprise:

in response to determining that the number of consecutive data units in the input data stream match the number of consecutive data units in the history buffer, performing:

generating a copy pointer symbol referencing previously received data units in the history buffer, and indicating the number and a history buffer displacement count of a start of the consecutive data units in the history buffer; and outputting the copy pointer symbol in the compressed output data stream in a computer storage.

6. The computer program product of claim 4, wherein the operations further comprise:

updating the literal queue to move the data unit in the literal queue matching the data unit at the current position to a top of the literal queue in response to determining that the data unit in the literal queue matching the data unit at the current position is not already at to the top of the literal queue.

7. The computer program product of claim 4, wherein the encodings of the literal displacement counts in the variable length code table include a prefix indicating a number of following bits used to indicate the literal displacement count in the literal queue.

8. The computer program product of claim 7, wherein a first prefix value of 1 bit indicates that a next following six bits indicates one of literal displacement counts 0 through 63, wherein a second prefix value of two bits indicates that a next following six bits indicates one of literal displacement counts 64 through 127, and wherein a third prefix value of two bits indicates that a next following 7 bits indicates one of literal displacement counts 1289 through 255.

9. The computer program product of claim 5, wherein the variable length coding table used to determine the literal displacement count in the literal queue comprises a first variable length coding table, further comprising:

determining from a second variable length coding table an encoding of the number; and determining from a third variable length coding table an encoding of the history buffer displacement count, wherein the number and the history buffer displacement count included in the copy pointer symbol comprise the determined encodings of the number and the history buffer displacement count.

10. A system for compressing an input data stream to produce a compressed output data stream, comprising:

a compression unit including:

a variable length coding table having a first prefix of one bit which indicates that a next following one bit represents two or three data units; a second prefix of two bits which indicates that a next following one bit represents four or five data units; a third prefix of three bits which indicates that a next following one bit represents six or seven data units, and a fourth prefix of four bits which indicates that a next following one bit represents eight or nine data units;
a compression program executed to perform operations, the operations comprising:
determining whether a number of consecutive data units in the input data stream match the number of consecutive data units in a history buffer of previously received data units in the input data stream;
in response to determining that the number of consecutive data units in the input data stream match the number of consecutive data units in the history buffer, generating a copy pointer symbol indicating the copy pointer symbol referencing previously received data units in the history buffer and indicating a location of a start of the consecutive data units in the history buffer;
determining from the variable length code table an encoding of the number;
indicating in the generated copy pointer symbol the determined encoding of the number; and
outputting the copy pointer symbol in the compressed output data stream.

11. The system of claim 10, wherein the variable length code table comprises a first variable length code table, and wherein the operations further comprise:
determining a displacement count in the history buffer at which the number of matching consecutive data units start; and
determining from a second variable length code table an encoding of the displacement count in the history buffer, wherein the displacement count included in the copy pointer symbol comprises the encoding of the displacement count.

12. A system for compressing an input data stream to produce a compressed output data stream, comprising:
a compression unit including:
a variable length coding table;
a compression program executed to perform operations, the operations comprising:
determining whether a number of consecutive data units in the input data stream match the number of consecutive data units in a history buffer of previously received data units in the input data stream; and
in response to determining that there are no consecutive data units at a current position in the input data stream matching consecutive data units in the history buffer, performing:
determining a literal displacement count in a literal queue including the data unit at the current position;
determining from the variable length code table an encoding of the determined literal displacement count; and
outputting a literal symbol indicting a literal symbol followed by the determined encoding of the literal displacement count in the compressed output data stream in the computer storage.

13. The system of claim 12, wherein the operations further comprise:
in response to determining that the number of consecutive data units in the input data stream match the number of consecutive data units in the history buffer, performing:
generating a copy pointer symbol referencing previously received data units in the history buffer, and indicating the number and a history buffer displacement count of a start of the consecutive data units in the history buffer; and
outputting the copy pointer symbol in the compressed output data stream in a computer storage.

14. The system of claim 12, wherein the operations further comprise:
updating the literal queue to move the data unit in the literal queue matching the data unit at the current position to a top of the literal queue in response to determining that the data unit in the literal queue matching the data unit at the current position is not already at to the top of the literal queue.

15. The system of claim 13, wherein the variable length coding table used to determine the literal displacement count in the literal queue comprises a first variable length coding table, further comprising:
a second variable length coding table;
a third variable length coding table;
wherein the operations further comprise:
determining from the second variable length coding table an encoding of the number; and
determining from the third variable length coding table an encoding of the history buffer displacement count, wherein the number and the history buffer displacement count included in the copy pointer symbol comprise the determined encodings of the number and the history buffer displacement count.

16. A method for compressing an input data stream to produce a compressed output data stream, comprising:
determining whether a number of consecutive data units in the input data stream match the number of consecutive data units in a history buffer of previously received data units in the input data stream;
in response to determining that the number of consecutive data units in the input data stream match the number of consecutive data units in the history buffer, generating a copy pointer symbol indicating the copy pointer symbol referencing previously received data units in the history buffer and a indicating a location of a start of the consecutive data units in the history buffer;
determining from a variable length code table an encoding of the number, wherein the variable length code table has: a first prefix of one bit which indicates that a next following one bit represents two or three data units; a second prefix of two bits which indicates that a next following one bit represents four or five data units; a third prefix of three bits which indicates that a next following one bit represents six or seven data units, and a fourth prefix of four bits which indicates that a next following one bit represents eight or nine data units;
indicating in the generated copy pointer symbol the determined encoding of the number; and
outputting the copy pointer symbol in the compressed output data stream in a computer storage.

17. The method of claim 16, wherein the operations further comprise:
determining a displacement count in the history buffer at which the number of matching consecutive data units start; and
determining from a variable length code table an encoding of the displacement count in the history buffer, wherein the displacement count included in the copy pointer symbol comprises the encoding of the displacement count.

18. A method for compressing an input data stream to produce a compressed output data stream, comprising:

determining whether a number of consecutive data units in the input data stream match the number of consecutive data units in a history buffer of previously received data units in the input data stream;

in response to determining that there are no consecutive data units at a current position in the input data stream matching consecutive data units in the history buffer, performing:

determining a literal displacement count in a literal queue including the data unit at the current position;

determining from a variable length code table an encoding of the determined literal displacement count; and outputting a literal symbol indicting a literal symbol followed by the determined encoding of the literal displacement count in the compressed output data stream in the computer storage.

19. The method of claim 18, further comprising:

in response to determining that the number of consecutive data units in the input data stream match the number of consecutive data units in the history buffer, performing:

generating a copy pointer symbol referencing previously received data units in the history buffer, and indicating the number and a history buffer displacement count of a start of the consecutive data units in the history buffer; and outputting the copy pointer symbol in the compressed output data stream in a computer storage.

20. The method of claim 18, further comprising:

updating the literal queue to move the data unit in the literal queue matching the data unit at the current position to a top of the literal queue in response to determining that the data unit in the literal queue matching the data unit at the current position is not already at to the top of the literal queue.

21. The method of claim 19, wherein the variable length coding table used to determine the literal displacement count in the literal queue comprises a first variable length coding table, further comprising:

determining from a second variable length coding table an encoding of the number; and determining from a third variable length coding table an encoding of the history buffer displacement count, wherein the number and the history buffer displacement count included in the copy pointer symbol comprise the determined encodings of the number and the history buffer displacement count.

22. A computer readable storage medium including a data structure comprising:

a variable length code table having encodings of a number of consecutive data units in an input data stream that match the number of consecutive data units in a history buffer of previously received data units in the input data stream, wherein the variable length code table has: a first prefix of one bit which indicates that a next following one bit represents two or three data units; a second prefix of two bits which indicates that a next following one bit represents four or five data units; a third prefix of three bits which indicates that a next following one bit represents six or seven data units, and a fourth prefix of four bits which indicates that a next following one bit represents eight or nine data units, wherein the variable length code table is processed to determine an encoding of the number to include in a copy pointer symbol indicating the copy pointer symbol referencing previously received data units in the history buffer and indicating a location of a start of the consecutive data units in the history buffer.

23. The computer readable storage medium of claim 22, wherein the variable length code table further includes: a fifth prefix of five bits followed by one bit which represents ten or eleven data units; a sixth prefix of six bits followed by two bits which represents twelve through fifteen data units; a seventh prefix of seven bits followed by three bits which represents 16 through 23 data units; an eighth prefix of eight bits followed by three bits which represents 24 through 31 data units; and a ninth prefix of eight bits followed by eight bits which represents 32 through 271 data units.

24. The computer readable storage medium of claim 22, wherein the variable length code table comprises a first variable length code table, further comprising:

a second variable length coding table having encodings of numbers of consecutive data units at a current position in the input data stream matching consecutive data units in the history buffer; and a third variable length coding table having encodings of history buffer displacement counts, wherein the number and the history buffer displacement count included in the copy pointer symbol comprise the encodings of the number and the history buffer displacement count from the second and third variable length coding tables, respectively.

25. A computer readable storage medium including a data structure comprising:

a variable length code table having encodings of literal displacement counts of data units in a literal queue of data units, wherein in response to determining that there are no consecutive data units at a current position in an input data stream matching consecutive data units in a history buffer of previously received data units in the input data stream, the literal queue is processed to determine an encoding of a literal displacement count in the literal queue having the data unit at the current position in the input data stream, wherein a literal symbol is outputted indicting a literal symbol followed by the determined encoding of the literal displacement count in a compressed output data stream.

26. The computer readable storage medium of claim 25, wherein the encodings of the literal displacement counts in the variable length code table include a prefix indicating a number of following bits used to indicate the literal displacement count in the literal queue.

27. The computer readable storage medium of claim 26, wherein a first prefix value of 1 bit indicates that a next following six bits indicates one of literal displacement counts 0 through 63, wherein a second prefix value of two bits indicates that a next following six bits indicates literal displacement counts 64 through 127, and wherein a third prefix value of two bits indicates that a next following 7 bits indicates one of literal displacement counts 1289 through 255.

* * * * *